(12) United States Patent
Hoshino et al.

(10) Patent No.: US 8,729,740 B2
(45) Date of Patent: May 20, 2014

(54) SEMICONDUCTOR RELAY

(75) Inventors: Narutoshi Hoshino, Katano (JP); Yuichi Niimura, Osaka (JP); Shinsuke Taka, Ise (JP); Sachiko Mugiuda, Minoh (JP)

(73) Assignee: Panasonic Corporation, Osaka (JP)

( * ) Notice: Subject to any disclaimer, the term of this patent is extended or adjusted under 35 U.S.C. 154(b) by 339 days.

(21) Appl. No.: 12/812,587

(22) PCT Filed: Jan. 15, 2009

(86) PCT No.: PCT/JP2009/050472
§ 371 (c)(1),
(2), (4) Date: Jul. 12, 2010

(87) PCT Pub. No.: WO2009/091000
PCT Pub. Date: Jul. 23, 2009

(65) Prior Publication Data
US 2010/0295602 A1 Nov. 25, 2010

(30) Foreign Application Priority Data

Jan. 18, 2008 (JP) ................................. 2008-009831

(51) Int. Cl.
*H01H 19/14* (2006.01)
(52) U.S. Cl.
USPC ........... 307/115; 327/108; 327/109; 327/436; 250/551
(58) Field of Classification Search
USPC .................. 307/115, 116; 327/108, 109, 436; 250/551; 257/727
See application file for complete search history.

(56) References Cited

U.S. PATENT DOCUMENTS

| | | | | |
|---|---|---|---|---|
| 4,813,048 A | * | 3/1989 | Yamane et al. | 372/38.07 |
| 5,013,926 A | | 5/1991 | Aizawa | |
| 5,151,602 A | * | 9/1992 | Idaka et al. | 250/551 |
| 5,408,102 A | * | 4/1995 | Okumura | 250/551 |
| 5,418,381 A | * | 5/1995 | Aizawa | 250/551 |

(Continued)

FOREIGN PATENT DOCUMENTS

| | | |
|---|---|---|
| JP | 3-286620 A | 12/1991 |
| JP | 2004-200551 A | 7/2004 |
| JP | 2005-5779 A | 1/2005 |
| JP | 2006-49766 A | 2/2006 |

OTHER PUBLICATIONS

Taiwanese Office Action for the Application No. 098101739 dated May 29, 2012.

(Continued)

*Primary Examiner* — Jared Fureman
*Assistant Examiner* — Alfonso Perez Borroto
(74) *Attorney, Agent, or Firm* — McDermott Will & Emery LLP (57) ABSTRACT

A semiconductor relay of the invention includes first and second signal terminals, a substrate, a first switch circuit and a control circuit. The substrate includes signal patterns for forming a signal line between the first and second signal terminals. The first switch circuit has a semiconductor switch used to make or break the connection between the first and second signal terminals. The control circuit has a control IC for controlling the first switch circuit. The control IC is mounted on a land of the substrate. The land has a size corresponding to the control IC. A part or all of the land is included in a part of the signal patterns.

12 Claims, 7 Drawing Sheets

(56) References Cited

U.S. PATENT DOCUMENTS

| | | | |
|---|---|---|---|
| 5,559,466 A * | 9/1996 | Okumura et al. | 327/514 |
| 5,757,020 A * | 5/1998 | Torazawa et al. | 250/551 |
| 6,522,514 B1 * | 2/2003 | Torazawa | 361/93.1 |
| 6,710,317 B2 * | 3/2004 | Meadows | 250/205 |
| 6,762,493 B2 * | 7/2004 | Kojima et al. | 257/727 |
| 6,806,482 B2 * | 10/2004 | Yamagishi | 250/551 |
| 6,930,870 B2 * | 8/2005 | Nobe et al. | 361/103 |
| 7,102,869 B2 * | 9/2006 | Kato et al. | 361/173 |
| 2006/0027735 A1 | 2/2006 | Matsuyama | |
| 2007/0187629 A1 * | 8/2007 | Matsuyama | 250/551 |
| 2007/0190954 A1 * | 8/2007 | Murakami et al. | 455/132 |
| 2008/0238789 A1 * | 10/2008 | Wilcox | 343/750 |

OTHER PUBLICATIONS

International Search Report for the Application No. PCT/JP2009/050472 mailed Apr. 21, 2009.

* cited by examiner

SEMICONDUCTOR RELAY

TECHNICAL FIELD

The invention relates generally to semiconductor relays and, more particularly, to a semiconductor relay including: a semiconductor switch used to make or break the connection between first and second signal terminals; and a control IC configured to control the semiconductor switch.

BACKGROUND ART

Japanese Patent Application Publication No. 2005-5779 published on Jan. 6, 2005 discloses a semiconductor relay. For example, in the construction having no gate line (its third embodiment), the relay includes first and second signal terminals (output terminals), a substrate (a print board), first and second semiconductor switches (MOSFETs for output) and a control circuit (a charging and discharging control circuit). Hereinafter, this relay is referred to as a "prior art relay".

The substrate includes first and second signal patterns (output lines) and a land (a source line) which are formed on a surface of the substrate. The first and second signal patterns are located between the first and second signal terminals so as to form a signal line. The control circuit includes a light receiving chip (a control IC) that is mounted on the land.

The first semiconductor switch is used to make or break the connection between the first signal pattern and the land. The second semiconductor switch is used to make or break the connection between the second signal pattern and the land. Specifically, the gates of the first and second semiconductor switches are mutually connected and also connected to the light receiving chip. The sources of the first and second semiconductor switches are mutually connected and also connected to the land (source line). The drains of the first and second semiconductor switches are connected to the first and second signal patterns, respectively. Therefore, the first and second semiconductor switches are turned on or off at the same time. When the first and second semiconductor switches are turned on, the first semiconductor switch makes the connection between the first signal pattern and the land, and the second semiconductor switch also makes the connection between the second signal pattern and the land. Thereby, the first and the second signal terminals are mutually connected.

However, in the prior art relay, there is an issue that the impedance matching of the circuit including the signal line is disturbed. That is, since the first and second signal terminals are mutually connected through the land, the land functions as a third signal pattern (a source line). Accordingly, all of the land becomes a stub with respect to the signal line (i.e., the first and second signal patterns).

DISCLOSURE OF THE INVENTION

It is an object of the invention to prevent all of a land on which a control IC of a control circuit is mounted from becoming a stub.

A semiconductor relay of the present invention comprises first and second signal terminals, a substrate, a first switch circuit and a control circuit. The substrate comprises signal patterns for forming a signal line, and a land. The signal patterns are located between the first and second signal terminals and separated from each other. The first switch circuit comprises a semiconductor switch that is used to make or break the connection between the signal patterns and thereby to make or brake the connection between the first and second signal terminals. The control circuit comprises a control IC that is configured to control the first switch circuit to make or break the connection between the first and second signal terminals. In an aspect of the invention, the control IC is mounted on the land. The land has a size corresponding to the control IC. A part or all of the land is included in a part of the signal patterns.

In this construction (hereinafter referred to as a "first construction"), since a part or all of the land is included in a part of the signal patterns, it is possible to prevent all of the land on which the control IC is mounted from becoming a stub.

In the first construction, the signal patterns may comprise first to third signal patterns. The first signal pattern is connected to the first signal terminal. The second signal pattern is connected to the second signal terminal. The third signal pattern is located between the ends of the first and second signal patterns in an intermediate part of the signal line and is separated from each of the first and second patterns. Preferably, the first switch circuit comprises first and second semiconductor switches. The first semiconductor switch is used to make or break the connection between the first and third signal patterns. The second semiconductor switch is used to make or break the connection between the second and third signal patterns. Preferably, the control IC is configured to control the first and second semiconductor switches to make or break the connection between the first and second signal terminals. Preferably, the part of the land is included in the third signal pattern, while the remaining part of the land sticks out from the side of the third signal pattern. In this construction (hereinafter referred to as a "second construction"), it is possible to prevent all of the land on which the control IC is mounted from becoming a stub.

In the second construction, the control IC may comprise first and second control output terminals. The second control output terminal is connected to the third signal pattern through a wire. Preferably, the first and second semiconductor switches are mounted on said ends of the first and second signal patterns, respectively. Each of the first and second semiconductor switches may be a surface mount N channel MOSFET having a drain, a source and a gate. The drains of the first and second semiconductor switches may be directly connected to said ends of the first and second signal patterns, respectively. The sources of the first and second semiconductor switches may be connected to the third signal pattern through wires. The gates of the first and second semiconductor switches may be connected to the first control output terminal through wires.

In the second construction, the semiconductor relay may further comprise first and second control input terminals, a light emitting element and first and second low-pass filters. The light emitting element is configured to emit light in response to an input signal from the first and second control input terminals. The first low-pass filter is connected between the first control input terminal and one end of the light emitting element. The second low-pass filter is connected between the second control input terminal and the other end of the light emitting element. Preferably, the control IC comprises a light receiving element for obtaining the input signal by receiving the light from the light emitting element, and is configured to control the first and second, semiconductor switches in response to the input signal. Herein, if stray capacitance exists between the light emitting element and the patterns respectively connected to the light emitting element, resonance may occur by the C-coupling. In this instance, insertion loss increases around the frequency of the resonance, and accordingly the frequency band of the semiconductor relay is reduced. In this invention, the first and second low-pass filters can avoid generating of the resonance, and accordingly the frequency band of the semiconductor relay can be prevented from being reduced.

In the first construction, the signal patterns may comprise first to third signal patterns. The first signal pattern is connected to the first signal terminal. The second signal pattern is connected to the second signal terminal. The third signal pattern is located between the ends of the first and second patterns in an intermediate part of the signal line and is separated from each of the first and second patterns. Preferably, the first switch circuit comprises first and second semiconductor switches. The first semiconductor switch is used to make or break the connection between the first and third signal patterns. The second semiconductor switch is used to make or break the connection between the second and third signal patterns. Preferably, the control circuit comprises first and second control ICs, and is configured to control the first and second semiconductor switches to make or break the connection between the first and second signal terminals. The first control IC is configured to control the first semiconductor switch to make or break the connection between the first and third signal patterns. The second control IC is configured to control the second semiconductor switch to make or break the connection between the second and third signal patterns. Preferably, the substrate comprises: a first land on which the first control IC is mounted; and a second land on which the second control IC is mounted. A part of the first land is included in the first signal pattern, while the remaining part of the first land sticks out from the side of the first signal pattern. A part of the second land is included in the second signal pattern, while the remaining part of the second land sticks out from the side of the second signal pattern. In this construction (hereinafter referred to as a "third construction"), all of the land on which the control IC is mounted can be prevented from becoming stub.

In the third construction, each of the first and second control ICs may comprise first and second control output terminals. Preferably, the second control output terminals of the first and second control ICs are connected to the first and second signal patterns through wires, respectively. Preferably, the first and second semiconductor switches are mounted on both ends of the third signal pattern. Each of the first and second semiconductor switches may be a surface mount N channel MOSFET having a drain, a source and a gate. The drains of the first and second semiconductor switches may be directly connected to the third signal pattern. The sources of the first and second semiconductor switches may be connected to the first and second signal patterns through wires, respectively. The gates of the first and second semiconductor switches may be connected to the first control output terminals of the first and second control ICs through wires, respectively.

In the third construction, the semiconductor relay may further comprise first, second, third and fourth control input terminals, first and second light emitting elements, and first, second, third and fourth low-pass filters. The first light emitting element is configured to emit light in response to a first input signal from the first and second control input terminals. The second light emitting element is configured to emit light in response to a second input signal from the third and fourth control input terminals. The first low-pass filter is connected between the first control input terminal and one end of the first light emitting element. The second low-pass filter is connected between the second control input terminal and the other end of the first light emitting element. The third low-pass filter is connected between the third control input terminal and one end of the second light emitting element. The fourth low-pass filter is connected between the fourth control input terminal and the other end of the second light emitting element. Preferably, the first control IC comprises a first light receiving element for obtaining the first input signal by receiving the light from the first light emitting element, and is configured to control the first semiconductor switch in response to the first input signal. Similarly, the second control IC comprises a second light receiving element for obtaining the second input signal by receiving the light from the second light emitting element, and is configured to control the second semiconductor switch in response to the second input signal. In this construction, the frequency band of the semiconductor relay cannot be prevented from being reduced.

In one of the second and third constructions, the semiconductor relay may further comprise a third signal terminal, a diverging circuit and a second switch circuit. The diverging circuit comprises a low-pass filter connected to a divergence point in one of the first and second signal patters. The second switch circuit comprises a semiconductor switch that is used to make or break the connection between the low-pass filter of the diverging circuit and the third signal terminal and thereby to make or break the connection between the third signal terminal and the divergence point. In this construction (hereinafter referred to as a "fourth construction"), direct current power can be supplied from the third signal terminal to the divergence point, and also a low frequency signal or a direct current signal can be detected from the divergence point. Moreover, since the third signal terminal is connected to the divergence point through the low-pass filter of the diverging circuit, it is possible to prevent the diverging circuit side from being stub with respect to the signal line between the first and second signal terminals (e.g., a high frequency signal line). Accordingly, for example, high frequency characteristic of the semiconductor relay can be prevented from being spoiled.

In the fourth construction, it is preferable that the low-pass filter of the diverging circuit is a surface mount device and is directly mounted on the divergence point. In this construction, a conductive pattern capable of forming a stub can be removed.

In the fourth construction, it is preferable that the width of a part with the divergence point in one of the first and second signal patterns is narrower than that of a part without the divergence point. In this construction, the impedance reduction in the divergence point can be restrained.

In one of the second and third constructions, the semiconductor relay may further comprise a third signal terminal, a diverging circuit and a second switch circuit. The diverging circuit comprises a composite filter connected to a divergence point in one of the first and second signal patters.

The second switch circuit comprises a semiconductor switch that is used to make or break the connection between the composite filter and the third signal terminal and thereby to make or break the connection between the third signal terminal and the divergence point. The composite filter is formed of a high cut-off filter and a low cut-off filter. In this construction (hereinafter referred to as a "fifth construction"), it is possible to expand the frequency band of the signal that can be flown between the third signal terminal and the diverging circuit.

In the fifth construction, it is preferable that the low-cut filter is connected to the divergence point and the high-cut filter is connected between the low-cut filter and the second switch circuit. In this construction, the low-cut filter side becomes a stub sticking out from the divergence point and resonance may occur. However, even if resonance occurs, the high-cut filter attenuates the frequency of the resonance and accordingly the high frequency characteristic of the semiconductor can be improved.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

First Embodiment

Figure 1:
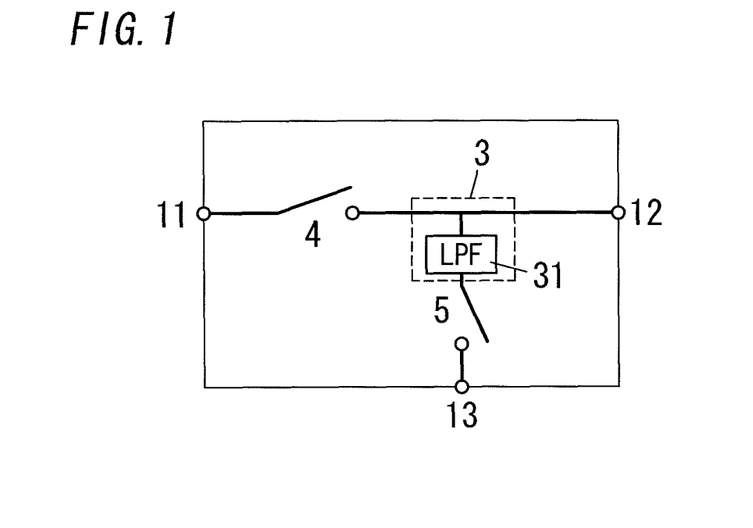
FIG. 1 is a schematic diagram of a semiconductor relay in accordance with a first embodiment of the present invention.
Figure 2:
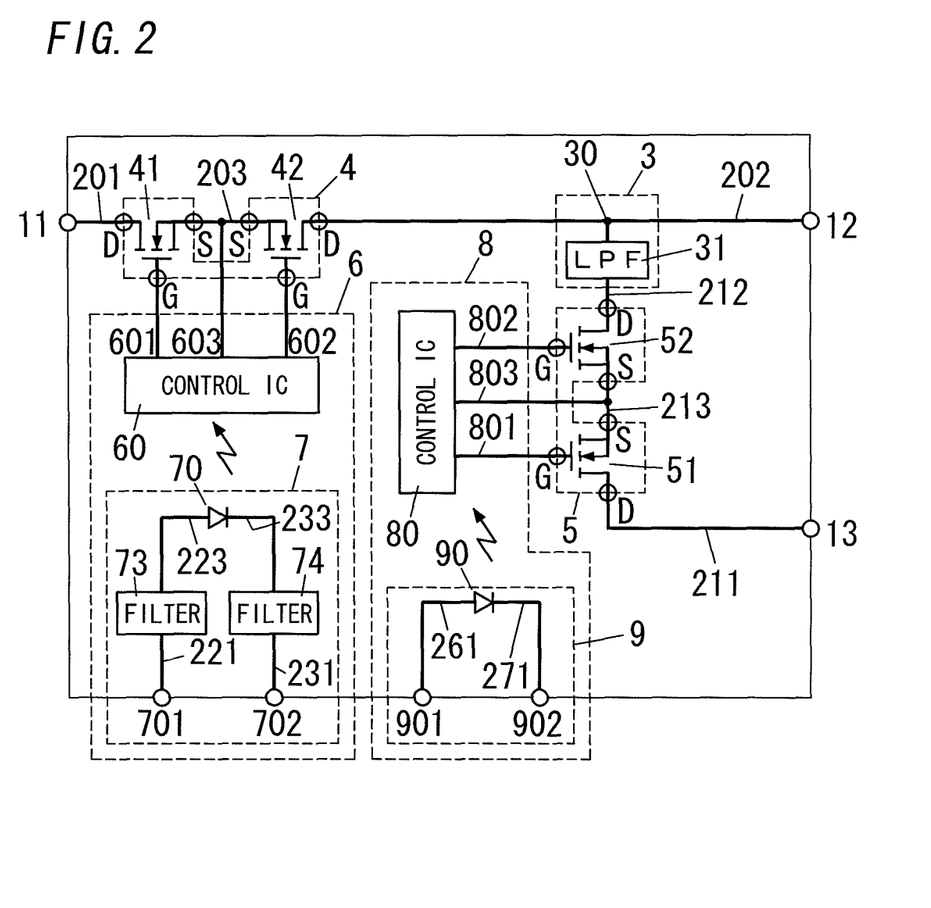
FIG. 2 is a circuit block diagram of the semiconductor relay.
Figure 3:
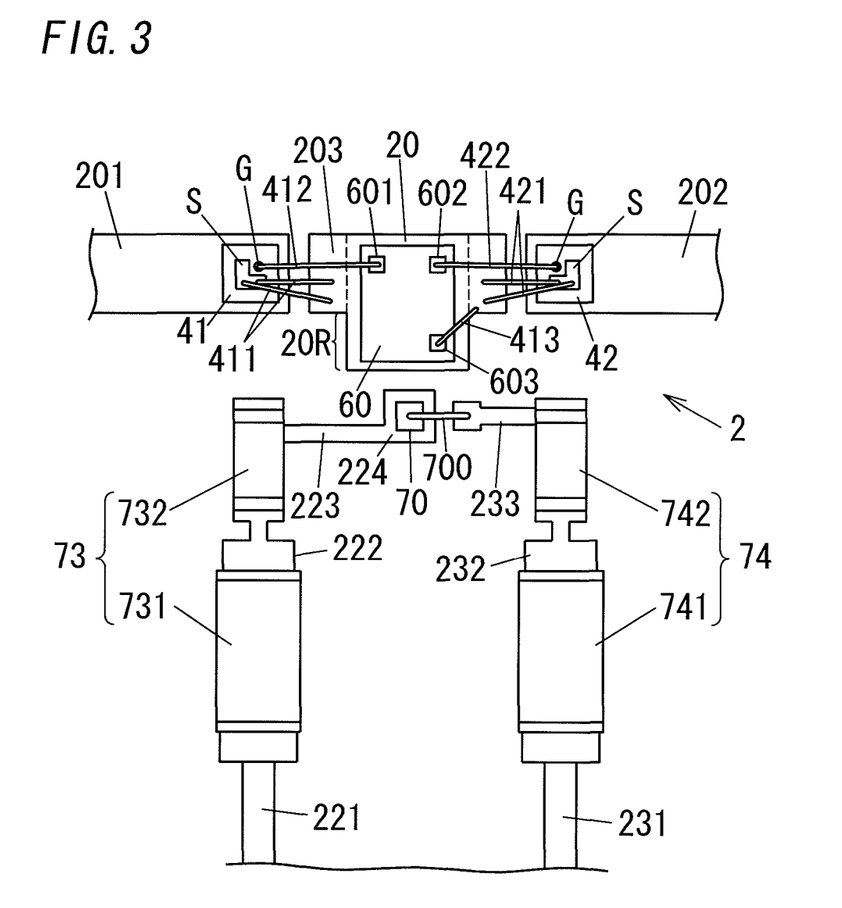
FIG. 3 illustrates a part of surface structure of the semiconductor relay.

FIGS. 1-3 show a semiconductor relay in accordance with a first embodiment of the present invention. The semiconductor relay is, for example, a high frequency relay, and has signal terminals 11, 12 and 13, a substrate 2, a diverging circuit 3, switch circuits 4 and 5, and control circuits 6 and 8.

As shown in FIGS. 2 and 3, the substrate 2 is, for example, a dielectric substrate, and has signal patterns, wiring patterns and lands that are formed on a surface of the substrate 2. For example, the substrate 2 includes signal patterns 201-203 for forming a signal line (a first signal line). The signal pattern 201 is connected to the signal terminal 11 (a first signal terminal). The signal pattern 202 is connected to the signal terminal 12 (a second signal terminal). That is, both ends of the first signal line are connected to the signal terminals 11 and 12, respectively. The signal pattern 203 is located between the ends of the signal patterns 201 and 202 in an intermediate part of the first signal line (i.e., a part between both ends of the first signal line), and is separated from each of the signal patterns 201 and 202 by a specified insulation distance. In the examples of FIGS. 2 and 3, the signal patterns are in the shape of a straight line having a constant width. Thus, although the signal patterns 201-203 are formed on the surface (superior surface) of the substrate 2 having a certain width, a ground pattern (not shown) is formed on, for example, the inferior surface of the substrate 2 along the signal patterns 201-203. That is, the signal patterns 201-203, the ground pattern and the substrate 2 constitute a microstrip line.

As shown in FIG. 2, the substrate 2 also includes signal patterns 211-213 for forming a second signal line. The signal pattern 211 is connected to the signal terminal 13 (a third signal terminal). The signal pattern 212 is connected to the diverging circuit 3. That is, both ends of the second signal line are connected to the signal terminal 13 and the diverging circuit 3, respectively. The signal pattern 213 is located between the ends of the signal patterns 211 and 212 in an intermediate part of the second signal line (i.e., a part between both ends of the second signal line), and is separated from each of the signal patterns 211 and 212 by a specified insulation distance. The wiring patterns and the lands are described later.

The diverging circuit 3 includes an LPF (a low-pass filter) 31 connected to a divergence point 30 in one of the signal patterns 201 and 202 (in the example of FIG. 2, the signal pattern 202). First and second ends of the LPF 31 are connected to the signal patterns 212 and 202, respectively. Preferably, the divergence point 30 is included in one of the signal patterns 201 and 201 (in the example of FIG. 2, the signal pattern 202), and the second end of the LPF 31 is directly connected to the divergence point 30.

As shown in FIGS. 2 and 3, the switch circuit 4 (a first switch circuit) includes semiconductor switches 41 and 42 used to make or break the connection between the signal terminals 11 and 12. For example, the semiconductor switch 41 (a first semiconductor switch) is a surface mount N channel MOSFET having a drain (D), a source (S) and a gate (G), and is used to make or break the connection between the signal patterns 201 and 203. Similarly, the semiconductor switch 42 (a second semiconductor switch) is a surface mount N channel MOSFET having a drain (D), a source (S) and a gate (G), and is used to make or break the connection between the signal patterns 202 and 203. Specifically, each MOSFET of the switch circuit 4 has a drain (d) located on its own bottom surface, and a source (S) and a gate (G) that are located on its own top surface. The semiconductor switches 41 and 42 are mounted on the above-mentioned ends of the signal patterns 201 and 202 by die bonding, respectively and thereby both drains of them are directly connected to the ends of the signal patterns 201 and 202, respectively. The source (S) of the semiconductor switch 41 is connected to the signal pattern 203 through at least one bonding wire (in FIG. 3, wires 411 and 411). The source (S) of the semiconductor switch 42 is also connected to the signal pattern 203 through at least one bonding wire (in FIG. 3, wires 421 and 421). Each MOSFET of the switch circuit 4 has a body diode and an electric current can flow from its own source to drain, but the sources of the semiconductor switches 41 and 42 are mutually connected and thereby the anodes of both body diodes are mutually connected. Accordingly, the switch circuit 4 can be employed as an alternate current switch (e.g., a high frequency transmission switch).

Similarly, as shown in FIG. 2, the switch circuit 5 (a second switch circuit) includes semiconductor switches 51 and 52 used to make or break the connection between the signal terminal 13 and the diverging circuit 3. For example, the semiconductor switch 51 (a first semiconductor switch) is a surface mount N channel MOSFET having a drain (D), a source (S) and a gate (G), and is used to make or break the connection between the signal patterns 211 and 213. The semiconductor switch 52 (a second semiconductor switch) is a surface mount N channel MOSFET having a drain (D), a source (S) and a gate (G), and is used to make or break the connection between the signal patterns 212 and 213. Specifically, each of the semiconductor switches 51 and 52 has a drain (d) located on its own bottom surface, and a source (S) and a gate (G) that are located on its own top surface. The semiconductor switches 51 and 52 are mounted on the above-mentioned ends of the signal patterns 211 and 212 by die bonding, respectively and thereby both drains of them are directly connected to the ends of the signal patterns 211 and 212, respectively. The source (S) of the semiconductor switch 51 is connected to the signal pattern 213 through at least one bonding wire (not shown). The source (S) of the semiconductor switch 52 is also connected to the signal pattern 213 through at least one bonding wire (not shown). The sources of the semiconductor switches 51 and 52 are mutually connected, and accordingly the switch circuit 5 can be also employed as an alternate current switch (e.g., a low frequency transmission switch).

The control circuit 6 (a first control circuit) has a control IC 60 that is configured to control the switch circuit 4 to make or break the connection between the signal terminals 11 and 12. In the examples of FIGS. 2 and 3, the control circuit 6 is formed of a light emitting circuit 7 and a control IC 60 that are covered with transparent resin member (not shown) to be optically coupled to each other. The transparent resin member is also covered with a thin film having a light blocking effect in order to prevent disturbance light from entering the transparent resin member.

The light emitting circuit 7 includes control input terminals 701 and 702 (first and second control input terminals), composite filters 73 and 74 (first and second composite filters), and a light emitting element 70. The control input terminals 701 and 702 are connected to first ends of the wiring patterns 221 and 231, respectively.

The composite filter 73 is a first low-pass filter configured to attenuate higher frequencies than a predetermined cut-off frequency, and is formed of, for example, LPFs (low-pass filters) 731 and 732 having cut-off frequencies different from each other. First and second ends of the LPF 731 are connected to a second end (a land) of the wiring pattern 221 and a first end (a land) of a wiring pattern 222, respectively. First and second ends of the LPF 732 are connected to a second end (a land) of the wiring pattern 222 and a first end (a land) of a wiring pattern 223, respectively.

The composite filter 74 is a second low-pass filter configured to attenuate higher frequencies than a predetermined cut-off frequency, and is formed of, for example, LPFs (low-pass filters) 741 and 742 having cut-off frequencies different from each other. First and second ends of the LPF 741 are connected to a second end (a land) of the wiring pattern 231 and a first end (a land) of a wiring pattern 232, respectively. First and second ends of the LPF 742 are connected to a second end (a land) of the wiring pattern 232 and a first end (a land) of a wiring pattern 233, respectively.

The light emitting element 70 is, for example, an LED (a light emitting diode) that emits light in response to an input signal (an electric current signal) from the control input terminals 701 and 702. In the example of FIG. 3, the light emitting element 70 is a surface mount device, and the anode and cathode of the light emitting element 70 are located on the bottom and top surfaces of the device, respectively. The light emitting element 70 is mounted on a land 224 formed at a second end of the wiring pattern 223 by die bonding, and thereby the anode of the light emitting element 70 is directly connected to the land 224. The cathode of the light emitting element 70 is connected to a second end of the wiring pattern 233 through, for example, a bonding wire 700. The wiring patterns 223 and 233 (especially the land 224) are located in the proximity of the control IC 60.

The control IC 60 is configured to control the semiconductor switches 41 and 42 to make or break the connection between the signal terminals 11 and 12. For example, the control IC 60 includes a light receiving element (e.g., a photodiode array) for obtaining the input signal by receiving the light from the light emitting element 70, and is configured to control the semiconductor switches 41 and 42 in response to the input signal. Preferably, the light emitting element 70 and the light receiving element are located so that the light receiving surface of the light receiving element faces the light emitting surface of the light emitting element 70. In the example of FIG. 3, the control IC 60 has first control output terminals 601 and 602, and a second control output terminal 603. However, not limited to this, the control IC 60 may have one first control output terminal. The first control output terminals 601 and 602 are connected to the gates of the semiconductors 41 and 42 through bonding wires 412 and 422, respectively. The second control output terminal 603 is connected to the signal pattern 203 through a bonding wire 413. That is, the second control output terminal 603 is electrically connected to the sources of the semiconductor switches 41 and 42 through the signal pattern 203. For example, the control IC 60 includes a photodiode array and a charging and discharging circuit that are put in a package, in the same way as the prior art relay. If the photodiode array receives light from the light emitting element 70 to generate photovoltaic power, the charging and discharging circuit supplies the photovoltaic power to each of the semiconductor switches 41 and 42 through the first control output terminals 601 and 602 and the second control output terminal 603. Accordingly, the semiconductor switches 41 and 42 are turned on. Unless the photodiode array generate photovoltaic power, the charging and discharging circuit discharges an electric charge between each gate and source of the semiconductor switches 41 and 42. Accordingly, the semiconductor switches are turned off.

The control circuit 8 (a second control circuit) has a control IC 80 that is configured to control the switch circuit 5 to make or break the connection between the signal terminal 13 and the diverging circuit 3. The control circuit 8 is formed of a light emitting circuit 9 and a control IC 80.

The light emitting circuit 9 includes control input terminals 901 and 90, and a light emitting element 90. The control input terminal 901 and 902 are connected to first ends of wiring patterns 261 and 271, respectively.

The light emitting element 90 is, for example, a surface mount device that is an LED (a light emitting diode) configured to emit light in response to an input signal from the control input terminals 901 and 902. The anode and cathode of the light emitting element 90 are located on the bottom and top surfaces of the device, respectively. The light emitting element 90 is mounted on a land formed at a second end of the wiring pattern 261 by die bonding, and thereby the anode of the light emitting element 90 is directly connected to the land. The cathode of the light emitting element 90 is connected a second end of the wiring pattern 271 through, for example, a bonding wire (not shown).

The control IC 80 is configured to control the semiconductor switches 51 and 52 to make or break the connection between the signal terminal 13 and the diverging circuit 3. For example, the control IC 80 includes a light receiving element (e.g., a photodiode array) for obtaining an input signal from the control input terminals 901 and 902 by receiving light from the light emitting element 90, and is configured to control the semiconductor switches 51 and 52 in response to the input signal. Preferably, the light emitting element 90 and the light receiving element are located so that the light receiving surface of the light receiving element faces the light emitting surface of the light emitting element 90. The control IC 80 has first control output terminals 801 and 802, and a second control output terminal 803, and is formed of, for example, a photodiode array and a charging and discharging circuit like the control IC 60. The first control output terminals 801 and 802 are connected to the gates of the semiconductors 51 and 52 through bonding wires, respectively. The second control output terminal 803 is connected to the signal pattern 213 through a bonding wire. That is, the second control output terminal 803 is electrically connected to the sources of the semiconductor switches 51 and 52 through the signal pattern 213. If the photodiode array of the control IC 80 receives light from the light emitting element 90 to generate photovoltaic power, the charging and discharging circuit supplies the photovoltaic power to each of the semiconductor switches 51 and 52 through the first control output terminals 801 and 802 and the second control output terminal 803.

In case the control IC 80 turns the semiconductor switches 51 and 52 off, if the control IC 60 turns the semiconductor switches 41 and 42 on, the signal terminals 11 and 12 are electrically connected, and a first signal line is formed between the signal terminals 11 and 12. Accordingly, for example, a high frequency signal can be transmitted through the first signal line. If the control IC 60 turns the semiconductor switches 41 and 42 off, the connection between the signal terminals 11 and 12 is broken.

In case the control IC 80 turns the semiconductor switches 51 and 52 on, if the control IC 60 turns the semiconductor switches 41 and 42 on, the second signal line is formed between the signal terminals 12 and 13. For example, if a low frequency signal or a direct current signal is supplied to the signal terminal 13, the low frequency signal or the direct current signal is supplied to apparatus connected to the signal terminal 12. If the apparatus connected to the signal terminal 12 supplies a low frequency signal or a direct current signal to the signal terminal 12, the low frequency signal or the direct current signal can be received from the signal terminal 13.

In an aspect of the first embodiment, as shown in FIG. 3, the control IC 60 is mounted on a land 20 by die bonding. The land 20 has a size corresponding to the control IC 60. A part of the land 20, which is e.g., equal to or greater than half, is included in a part of the signal patterns 201-203 (in FIG. 3, the signal pattern 203), and the remaining part 20R of the land 20 sticks out from the side of the signal pattern 203. However, not limited to this, all of the land 20 may be included in the signal pattern 203.

The operations of the first embodiment is explained. If an input signal is supplied to the control input terminals 701 and 702, the light emitting element 70 emits light. The photodiode array of the control IC 60 receives the light from the light emitting element 70, and then generates photovoltaic power. The charging and discharging circuit of the control IC 60 then supplies the photovoltaic power to each of the semiconductor switches 41 and 42 through the first control output terminals 601 and 602 and the second control output terminal 603. Thereby, the semiconductor switches 41 and 42 are turned on, and accordingly the signal terminals 11 and 12 are electrically connected.

Unless an input signal is supplied to the control input terminals 701 and 702, the light emitting element 70 does not emit light and accordingly the photodiode array of the control IC 60 does not generate photovoltaic power. In this instance, the charging and discharging circuit of the control IC 60 discharges an electric charge between each gate and source of the semiconductor switches 41 and 42. Thereby, since the semiconductor switches 41 and 42 are turned off, the connection between the signal terminals 11 and 12 is broken.

If an input signal is supplied to the control input terminals 901 and 902, the light emitting element 90 emits light and the photodiode array of the control IC 80 generates photovoltaic power. The charging and discharging circuit of the control IC 80 then supplies the photovoltaic power to each of the semiconductor switches 51 and 52 through the first control output terminals 801 and 802 and the second control output terminal 803. Thereby, since the semiconductor switches 51 and 52 are turned on, the signal terminal 13 and the diverging circuit 3 are electrically connected. That is, the signal terminal 13 is electrically connected to the signal pattern 202 and the signal terminal 12 through the diverging circuit 3. Accordingly, only a low frequency signal or a direct current signal can be supplied to the signal terminal 13, and can be also obtained from the signal terminal 13.

Unless an input signal is supplied to the control input terminals 901 and 902, the light emitting element 90 does not emit light and accordingly the photodiode array of the control IC 80 does not generate photovoltaic power. In this instance, the charging and discharging circuit of the control IC 80 discharges an electric charge between each gate and source of the semiconductor switches 51 and 52. Thereby, since the semiconductor switches 51 and 52 are turned off, the connection between the signal terminals 12 and 13 is broken.

In the first embodiment, since the control IC 60 is mounted on the land 20 having a size corresponding to the control IC 60 and a part of the land 20 is included in the signal pattern 203, all of the land 20 can be prevented from becoming a stub. Accordingly, the high frequency characteristic of the semiconductor relay can be improved in comparison with the prior art relay having a land all of which becomes a stub.

Figure 4:
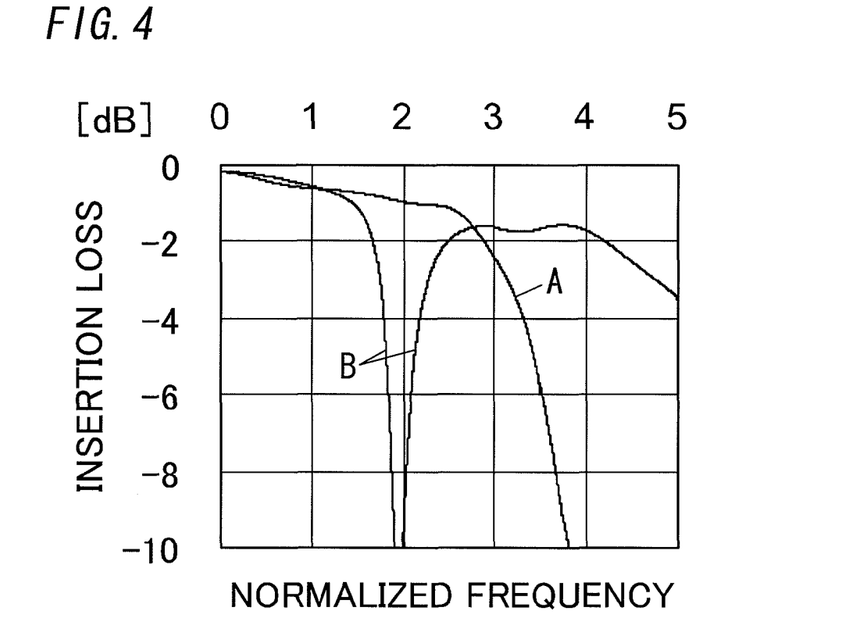
FIG. 4 illustrates the analyzed results of insertion losses of the prior art relay and the first embodiment.

FIG. 4 shows the analyzed results of insertion losses of the prior art relay and the first embodiment. In FIG. 4, "A" is the analyzed result of the insertion loss of the first signal line in the first embodiment, and "B" is the analyzed result of the insertion loss of the signal line between the first and second signal terminals in the prior art relay. Each analysis was performed in construction having only corresponding signal line and control IC. In the prior art relay, since all of the land on which the light receiving chip is mounted becomes a stub, the resonance shown in FIG. 4 occurs, and the insertion loss increases in the proximity of the frequency of the resonance. Accordingly, the useable frequency band is reduced. In the first embodiment, since a part of the land 20 is included in the signal pattern 203, the occurrence of the resonance is avoided as shown in FIG. 4. Accordingly, the first embodiment can have a usable frequency band wider than that of the prior art relay.

Figure 5:
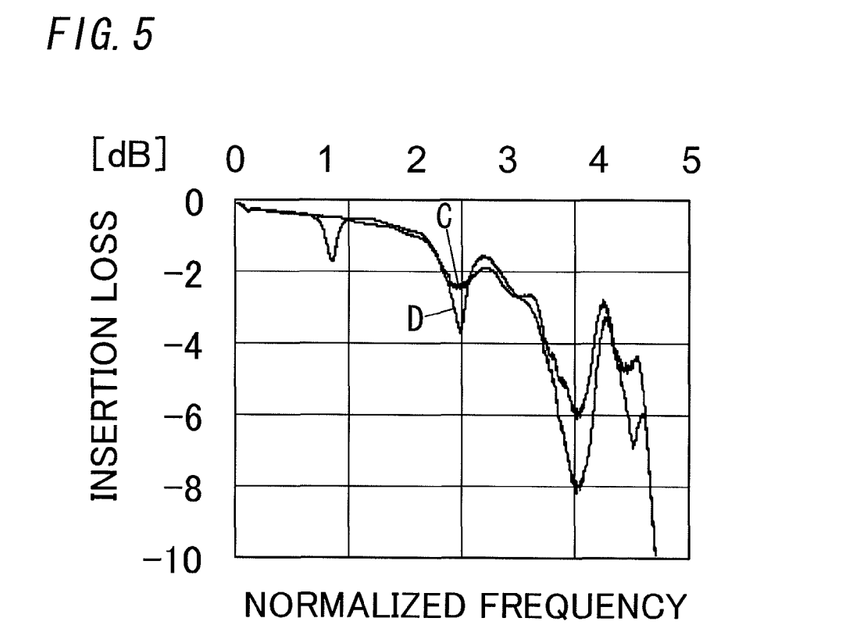
FIG. 5 illustrates a real measured insertion loss in the construction of FIG. 3 and a real measured insertion loss in a corresponding construction having no composite filter.

FIG. 5 shows a real measured insertion loss "C" in the construction of FIG. 3 and a real measured insertion loss "D" in a corresponding construction having no composite filter. The semiconductor relay of the first embodiment includes the light emitting circuit 7 in addition to the signal patterns 201-203 and the control IC 60, and the signal patterns 201-203 and the wiring patterns 223 and 233 are formed on the dielectric substrate. Accordingly, stray capacitance exists between the signal patterns and the wiring patterns. If the signal patterns and the wiring patterns are coupled by the stray capacitance and then the resonance occurs, the usable frequency band is reduced like FIG. 4. In the first embodiment, since the composite filters 73 and 74 are provided, the influence of resonance is restrained as shown in "C" of FIG. 5. Accordingly, the insertion loss can be reduced, and the high frequency characteristic of the semiconductor relay can be improved.

In addition, the second signal line of the signal patterns 211-213 is connected to the first signal line of the signal patterns 201-203 through the diverging circuit 3, and accordingly the second signal line (e.g., a low frequency signal line) can be prevented from becoming a stub.

Second Embodiment

Figure 6:
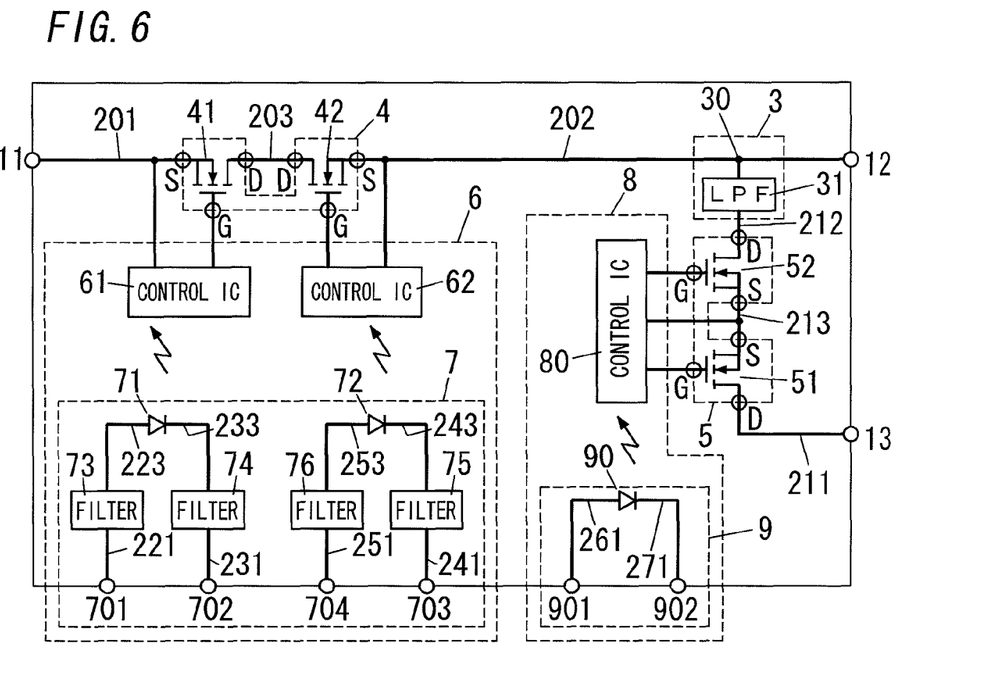
FIG. 6 is a circuit block diagram of a semiconductor relay in accordance with a second embodiment of the present invention.
Figure 7:
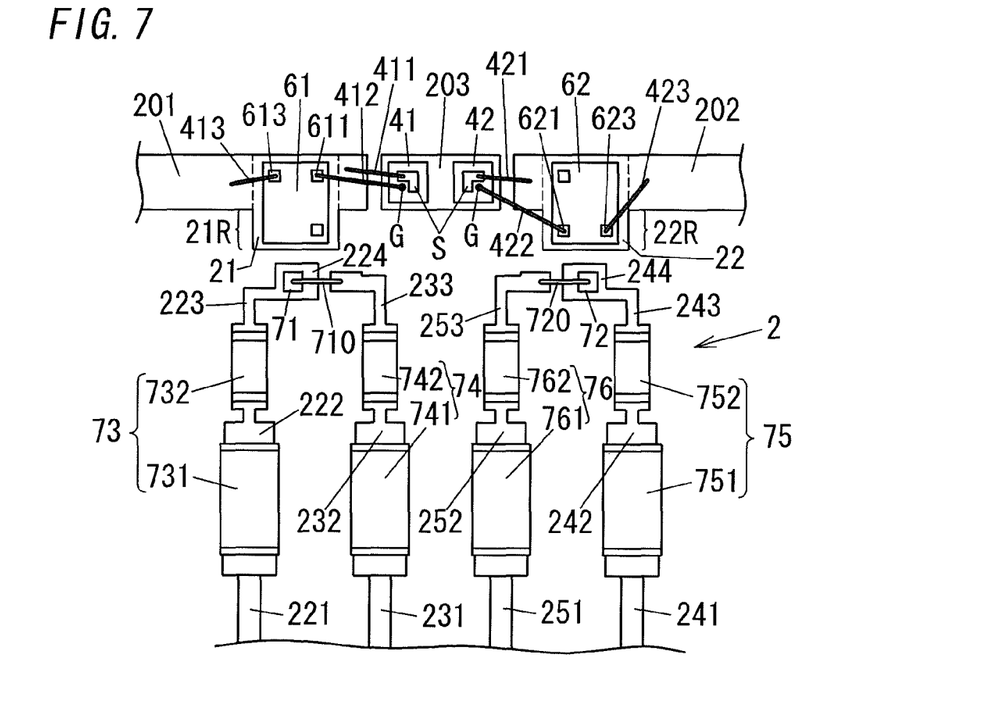
FIG. 7 illustrates a part of surface structure of the semiconductor relay.

FIGS. 6 and 7 show a semiconductor switch in accordance with a second embodiment of the present invention. The semiconductor relay is characterized by a substrate 2, a switch circuit 4 and a control circuit 6, and also includes signal terminals 11, 12 and 13, a diverging circuit 3, a switch circuit 5 and a control circuit 8 like the first embodiment. For the purpose of clarity, like kind elements are assigned the same reference numerals as depicted in the first embodiment.

The substrate 2 is, for example, a dielectric substrate, and includes signal patterns 211-213, wiring patterns 261 and 271, a land for a light emitting element 90, a land for a control IC 80, and a microstrip line like the first embodiment. The substrate 2 also includes signal patterns, wiring patterns and lands for the switch circuit 4 and the control circuit 6. For example, the substrate 2 includes signal patterns 201-203 for forming a first signal line. The signal pattern 201 is connected to the signal terminal 11 (a first signal terminal). The signal pattern 202 is connected to the signal terminal 12 (a second signal terminal). That is, both ends of the first signal line are connected to the signal terminals 11 and 12, respectively. The signal pattern 203 is located between the ends of the signal patterns 201 and 202 in an intermediate part of the first signal line (i.e., a part between both ends of the first signal line), and is separated by a specified insulation distance from each of the signal patterns 201 and 202. In the examples of FIGS. 6 and 7, the signal patterns 201-203 are in the shape of a straight line having a constant width. Wiring patterns and lands for the control circuit 6 are described later.

The switch circuit 4 (a first switch circuit) includes semiconductor switches 41 and 42 used to make or brake the connection between the signal terminals 11 and 12. For example, the semiconductor 41 (a first semiconductor switch) is a surface mount N channel MOSFET having a drain (D), a source (S) and a gate (G), and is used to make or brake the connection between the signal patterns 201 and 203. Similarly, the semiconductor 42 (a second semiconductor switch) is a surface mount N channel MOSFET having a drain (D), a source (S) and a gate (G), and is used to make or brake the connection between the signal patterns 202 and 203. Specifically, each MOSFET of the switch circuit 4 has a drain (D) located on its own bottom surface, and a source (S) and a gate (G) that are located on its own top surface. The semiconductor switches 41 and 42 are mounted on the above-mentioned ends of the signal patterns 203 by die bonding, respectively and thereby both drains of them are directly connected to the ends of the signal patterns 203, respectively. The source (S) of the semiconductor switch 41 is connected to the signal pattern 201 through at least one bonding wire 411. The source (S) of the semiconductor 42 is also connected to the signal pattern 202 through at least one bonding wire 421. The drains of the semiconductor switches 41 and 42 are mutually connected, and accordingly the switch circuit 4 can be employed as an alternate current switch (e.g., a high frequency transmission switch).

The control circuit 6 (a first control circuit) includes control ICs 61 and 62 (first and second control ICs). In the examples of FIGS. 6 and 7, the control circuit 6 is formed of a light emitting circuit 7 and the control ICs 61 and 62.

The light emitting circuit 7 includes control input terminals 701-704 (first to fourth control input terminals), composite filters 73-76 (first to fourth composite filters), and light emitting elements 71 and 72 (first and second light emitting elements). The control input terminals 701, 702, 703 and 704 are connected to first ends of the wiring patters 221, 231, 241 and 251, respectively. The control IC 61 and the light emitting circuit 71 are covered with transparent resin member (not shown) to be optically coupled to each other, and the transparent resin member is covered with a thin film having a light blocking effect. Similarly, the control IC 62 and the light emitting circuit 72 are covered with transparent resin member to be optically coupled to each other, and the transparent resin member is covered with a thin film having a light blocking effect.

The composite filter 73 is a first low-pass filter configured to attenuate frequencies higher than a predetermined cut off frequency, and is formed of, for example, LPFs (low-pass filters) 731 and 732 having cut off frequencies different from each other. First and second ends of the LPF 731 are connected to a second end (a land) of the wiring pattern 221 and a first end (a land) of a wiring pattern 222, respectively. First and second ends of the LPF 732 are connected to a second end (a land) of the wiring pattern 222 and a first end (a land) of a wiring pattern 223, respectively.

The composite filter 74 is a second low-pass filter configured to attenuate frequencies higher than a predetermined cut off frequency, and is formed of, for example, LPFs (low-pass filters) 741 and 742 having cut off frequencies different from each other. First and second ends of the LPF 741 are connected to a second end (a land) of the wiring pattern 231 and a first end (a land) of a wiring pattern 232, respectively. First and second ends of the LPF 742 are connected to a second end (a land) of the wiring pattern 232 and a first end (a land) of a wiring pattern 233, respectively.

The composite filter 54 is a third low-pass filter configured to attenuate frequencies higher than a predetermined cut off frequency, and is formed of, for example, LPFs (low-pass filters) 751 and 752 having cut off frequencies different from each other. First and second ends of the LPF 751 are connected to a second end (a land) of the wiring pattern 241 and a first end (a land) of a wiring pattern 242, respectively. First and second ends of the LPF 752 are connected to a second end (a land) of the wiring pattern 242 and a first end (a land) of a wiring pattern 243, respectively.

The composite filter 76 is a fourth low-pass filter configured to attenuate frequencies higher than a predetermined cut off frequency, and is formed of, for example, LPFs (low-pass filters) 761 and 762 having cut off frequencies different from each other. First and second ends of the LPF 761 are connected to a second end (a land) of the wiring pattern 251 and a first end (a land) of a wiring pattern 252, respectively. First and second ends of the LPF 762 are connected to a second end (a land) of the wiring pattern 252 and a first end (a land) of a wiring pattern 253, respectively.

The light emitting element 71 is, for example, an LED (a light emitting diode) that emits light in response to a first input signal (a current signal) from the control input terminals 701 and 702. In the example of FIG. 7, the light emitting element 71 is a surface mount device, and the anode and cathode of the light emitting element 71 are located on the bottom and top surfaces of the device, respectively. The light emitting element 71 is mounted on a land 224 formed on a second end of the wiring pattern 223 by die bonding, and thereby the anode of the light emitting element 71 is directly connected to the land 224. The cathode of the light emitting element 71 is connected to a second end of the wiring pattern 233 through, for example, a bonding wire 710. The wiring patterns 223 and 233 (especially the land 224) are located in the proximity of the control IC 61.

The light emitting element 72 is, for example, an LED (a light emitting diode) that emits light in response to a second input signal (a current signal) from the control input terminals 703 and 704. In the example of FIG. 7, the light emitting element 72 is a surface mount device, and the anode and cathode of the light emitting element 72 are located on the bottom and top surfaces of the device, respectively. The light emitting element 72 is mounted on a land 244 formed on a second end of the wiring pattern 243 by die bonding, and thereby the anode of the light emitting element 72 is directly connected to the land 244. The cathode of the light emitting element 72 is connected to a second end of the wiring pattern 253 through, for example, a bonding wire 720. The wiring patterns 243 and 253 (especially the land 244) are located in the proximity of the control IC 62.

The control ICs 61 and 62 are configured to control the semiconductor switches 41 and 42 to make or brake the connection between the signal terminals 11 and 12.

The control IC 61 includes, for example, a light receiving element for obtaining a first input signal from the control input terminals 701 and 702 by receiving light from the light emitting element 71. The control IC 61 is configured to control the semiconductor switch 41 in response to the first input signal to make or break the connection between the signal patterns 201 and 203. Preferably, the light emitting element 71 and the light receiving element are located so that the light receiving surface of the light receiving element faces the light emitting surface of the light emitting element 71. In the example of FIG. 7, the control IC 61 has first and second control output terminals 611 and 613. The first control output terminal 611 is connected to the gate of the semiconductor switch 41 through a bonding wire 412. The second control output terminal 613 is connected to the signal pattern 201 through a bonding wire 413.

The control IC 62 includes, for example, a light receiving element for obtaining a second input signal from the control input terminals 703 and 704 by receiving light from the light emitting element 72. The control IC 61 is configured to control the semiconductor switch 42 in response to the second input signal to make or break the connection between the signal patterns 202 and 203. Preferably, the light emitting element 72 and the light receiving element are located so that the light receiving surface of the light receiving element faces the light emitting surface of the light emitting element 72. In the example of FIG. 7, the control IC 62 has first and second control output terminals 621 and 623. The first control output terminal 621 is connected to the gate of the semiconductor switch 42 through a bonding wire 422. The second control output terminal 623 is connected to the signal pattern 202 through a bonding wire 423.

For example, each of the control ICs 61 and 62 includes a photodiode array and a charging and discharging circuit like the prior art relay, which are put in a package. If the photodiode array of the control IC 61 receives light from the light emitting element 71 and then generates photovoltaic power, the charging and discharging circuit of the control IC 61 supplies the photovoltaic power to the semiconductor switch 41 through the first and second output terminals 611 and 613. Similarly, if the photodiode array of the control IC 62 receives light from the light emitting element 72 and then generates photovoltaic power, the charging and discharging circuit of the control IC 62 supplies the photovoltaic power to the semiconductor switch 42 through the first and second output terminals 621 and 623. Accordingly, the semiconductor switches 41 and 42 are turned on. Unless each photodiode array of the control circuit 6 generates photovoltaic power, each charging and discharging circuit of the control circuit 6 discharges an electric charge between each gate and source of the semiconductor switches 41 and 42. Accordingly, the semiconductor switches 41 and 42 are turned off.

In an aspect of the second embodiment, as shown in FIG. 7, the control ICs 61 and 62 are mounted on the lands 21 and 22 by die bonding. The lands 21 and 22 have sizes corresponding to the control ICs 61 and 62, respectively. A part of the land 21, which is e.g., equal to or greater than half, is included in a part of the signal patterns 201-203 (in FIG. 7, the signal pattern 201), and the remaining part 21R of the land 21 sticks out from the side of the signal pattern 201. However, not limited to this, all of the land 21 may be included in the signal pattern 201. A part of the land 22, which is e.g., equal to or greater than half, is included in a part of the signal patterns 201-203 (in FIG. 7, the signal pattern 202), and the remaining part 22R of the land 22 sticks out from the side of the signal pattern 202. However, not limited to this, all of the land 22 may be included in the signal pattern 202.

The operations of the second embodiment are explained. If the first and second input signals are supplied to the control input terminals 701 and 702 and the control input terminals 703 and 704, respectively, the light emitting elements 71 and 72 emit light each. The photodiode array of the control IC 61 receives light from the light emitting element 71 and then generates photovoltaic power. The photodiode array of the control IC 62 also receives light from the light emitting element 72 and then generates photovoltaic power. The charging and discharging circuit of the control IC 61 supplies the semiconductor switch 41 with the photovoltaic power from the corresponding photodiode array through the first and second control output terminals 611 and 623. The charging and discharging circuit of the control IC 62 also supplies the semiconductor switch 42 with the photovoltaic power from the corresponding photodiode array through the first and second control output terminals 621 and 623. Thereby, the semiconductor switches 41 and 42 are turned on, and accordingly the signal terminals 11 and 12 are electrically connected.

Unless the first and second input signals are supplied to the control input terminals 701 and 702 and the control input terminals 703 and 704, each of the light emitting elements 71 and 72 does not emit light, and accordingly each photodiode of the control ICs 61 and 62 does not generate photovoltaic power. In this instance, the charging and discharging circuit of the control IC 61 discharges an electric charge between the gate and source of the semiconductor switch 41. The charging and discharging circuit of the control IC 62 also discharges an electric charge between the gate and source of the semiconductor switch 42. Thereby, the semiconductor switches 41 and 42 are turned off, and accordingly the connection between the signal terminals 11 and 12 is broken.

In the second embodiment, the control IC 61 is mounted on the land 21 having a size corresponding to the control IC 61, and a part of the land 21, which is e.g., equal to or greater than half, is included in the signal pattern 201. Similarly, the control IC 62 is mounted on the land 22 having a size corresponding to the control IC 62, and a part of the land 22, which is e.g., equal to or greater than half, is included in the signal pattern 202. Accordingly, all of the lands 21 and 22 can be prevented from becoming stubs, and the high frequency characteristic of the semiconductor relay can be improved in comparison with the prior art relay having a land all of which becomes a stub.

Figure 8:
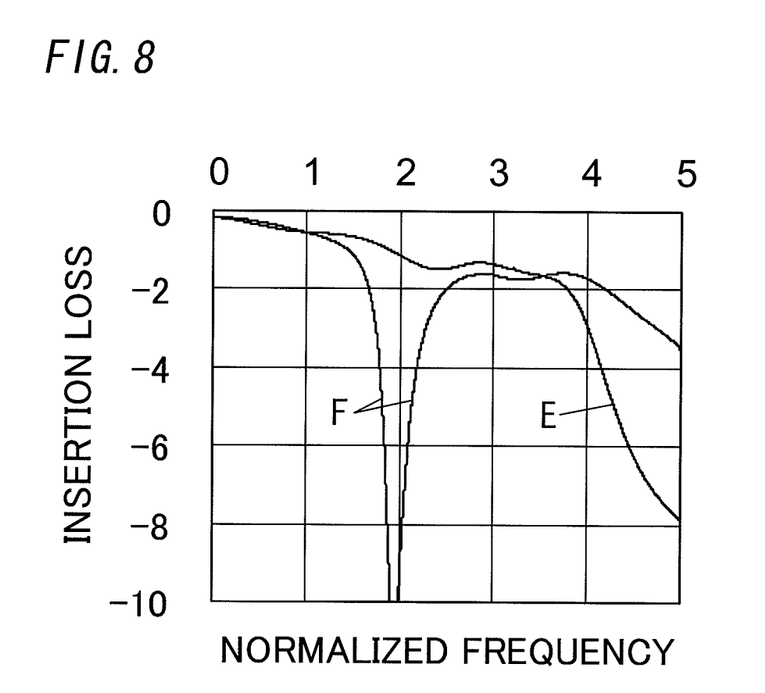
FIG. 8 illustrates the analyzed results of insertion losses of the prior art relay and the second embodiment.

FIG. 8 shows the analyzed results of insertion losses of the prior art relay and the second embodiment. In FIG. 8, "E" is the analyzed result of the insertion loss of the first signal line in the second embodiment, and "F" is the analyzed result of the insertion loss of the signal line between the first and second signal terminals in the prior art relay. Each analysis was performed in construction having only corresponding signal line and control IC. In the prior art relay, since all of the land on which the light receiving chip is mounted becomes a stub, the resonance shown in FIG. 8 occurs, and the insertion loss increases in the proximity of the frequency of the resonance. Accordingly, the usable frequency band is reduced. In the second embodiment, since a part of the land 21 is included in the signal pattern 201 and a part of the land 22 is included in the signal pattern 202, the occurrence of the resonance is avoided as shown in FIG. 8. Accordingly, the second embodiment can have a usable frequency band wider than that of the prior art relay.

In addition, since the composite filters 73-76 are provided, the influence of the resonance can be restrained like the first embodiment. As a result, insertion loss can be reduced, and the high frequency characteristic of the semiconductor relay can be improved.

Third Embodiment

Figure 9:
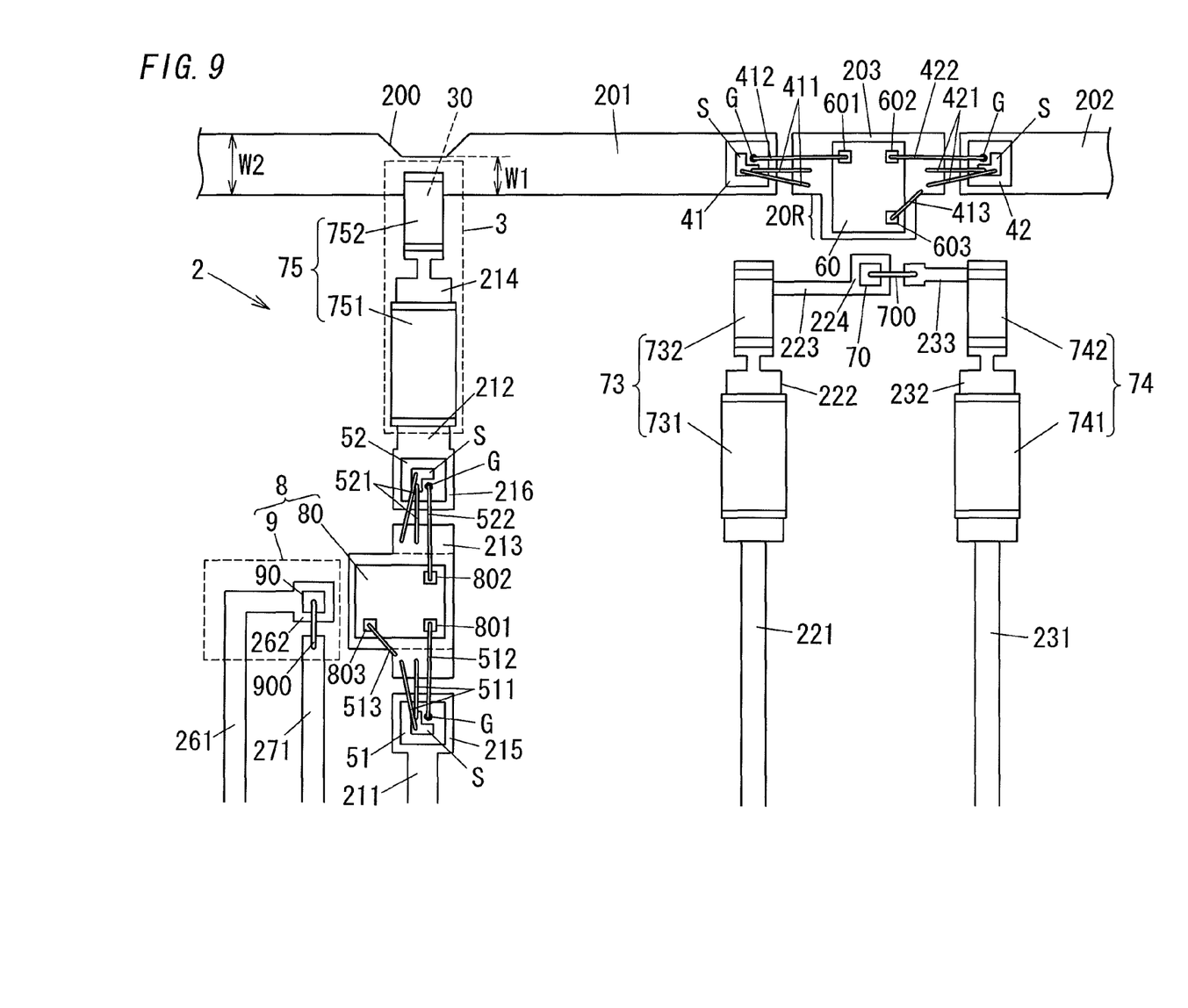
FIG. 9 illustrates a part of surface structure of a semiconductor relay in accordance with a third embodiment of the present invention.

FIG. 9 shows a semiconductor relay in accordance with a third embodiment of the present invention. The semiconductor relay is characterized by a diverging circuit 3, and also includes signal terminals 11, 12 and 13, a substrate 2, switch circuits 4 and 5, and control circuits 6 and 8 like the first embodiment. For the purpose of clarity, like kind elements are assigned the same reference numerals as depicted in the first embodiment. However, not limited to this, the aspect of the third embodiment (i.e., the diverging circuit 3 and a cut 200) can be applied to the second embodiment.

Semiconductor switches 51 and 52 of the switch circuit 5 are mounted on ends of the signal patterns 211 and 212 (lands 215 and 216), respectively and both drains of them are connected to the lands 215 and 216, respectively. The source (S) of the semiconductor switch 51 is connected to a signal pattern 213 through, for example, at least one bonding wire (in FIG. 9, wires 511 and 511). The source (S) of the semiconductor switch 52 is connected to the signal pattern 213 through, e.g., at least one bonding wire (in FIG. 9, wires 521 and 521).

The control circuit 8 is formed of a light emitting circuit 9 and a control IC 80. The light emitting circuit 9 includes control input terminals 901 and 902 (FIG. 2), and a light emitting element 90. The light emitting element 90 is mounted on a land 262 of a wiring pattern 261 by die bonding, and thereby the anode of the light emitting element 90 is directly connected to the land 262. The land 262 is located in the proximity of the control IC 80 like the control circuit 6. The cathode of the light emitting element 90 is connected to a wiring pattern 271 through, e.g., a bonding wire 900. The control IC 80 has first control output terminals 801 and 802 and a second control output 803 like the control IC 60. The first control output terminals 801 and 802 are connected to the gates (G) of the semiconductor switches 51 and 52 through bonding wires 512 and 522, respectively. The second control output terminal 803 is connected to the signal pattern 213 through a bonding wire 513.

The diverging circuit 3 includes a composite filter 75 connected to a divergence point 30 in one of the signal patterns 201 and 202 (in the example of FIG. 9, the signal pattern 201). The substrate 2 further includes a signal pattern 214 that is located between the signal patterns 201 and 202 and is separated from each of the signal patterns 201 and 212. A part of the signal pattern 211 (at least land 215 side), and the signal pattern 212-214 are arranged on the same straight line.

The composite filter 75 includes a high cut filter 751 and a low cut filter 752 which constitute a wide band filter. Each of the filters 751 and 752 is a surface mount device. First and second ends of the high cut filter 751 are connected to lands of the signal patterns 212 and 214, respectively. First and second ends of the low cut filter 752 are connected to lands of the signal patterns 214 and 201, respectively. For example, the high cut filter 751 and the low cut filter 752 are set so that the transmission band of the low cut filter 752 (a high-pass filter) is 1.5-3 times the cut-off frequency of the high cut filter 751 (a low-pass filter). In the signal pattern 201 of the example of FIG. 9, the width "W1" of a part having the divergence point 30 is narrower than the width "W2" of a part without the divergence point 30. The cut 200 is formed at the opposite edge of the divergence point 30 in order to reduce the width "W2" of the signal pattern 201 to the width "W1".

Thus, since the low cut filter 752 is directly connected to the divergence point 30 of the signal pattern 201, a conductive pattern capable of forming of a stub can be removed. Accordingly, the high frequency characteristic of the semiconductor relay can be improved. The impedance of a part having the divergence point 30 in the signal pattern 201 is reduced by the influence of the low cut filter 752, but the cut 200 is formed and accordingly mismatching of the impedance in the signal pattern 201 can be restrained.

Figure 10:
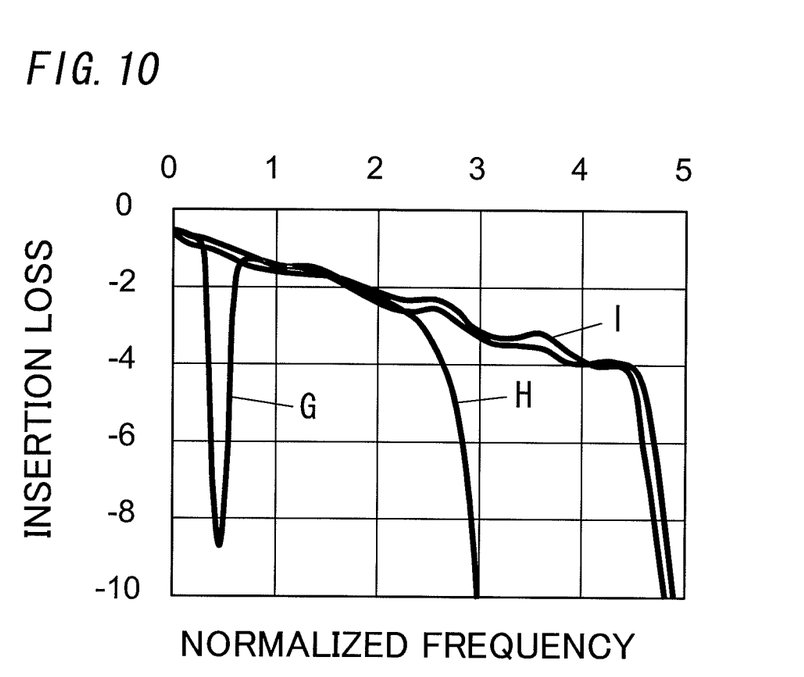
FIG. 10 is a characteristic curve of a composite filter in the third embodiment.

By forming the composite filter 75 from the high cut filter 751 and the low cut filter 752, the semiconductor relay can have a wide frequency band as shown in FIG. 10. In FIG. 10, "G", "H" and "I" show filter characteristics of the high cut filter 751, the low cut filter 752 and the composite filter 75, respectively.

If the low cut filter 752 and the high cut filter 751 are connected to the signal patterns 212 and 214 and the signal patterns 214 and 201, respectively, the high cut filter 751 and the signal pattern 214 become a stub and then resonance occurs. In this instance, the frequency of the resonance is higher than the cut-off frequency of the low cut filter 752, and accordingly the low cut filter 752 cannot attenuate the frequency of the resonance.

In the third embodiment, the high cut filter 751 and the low cut filter 752 are connected to the signal patterns 212 and 214 and the signal patterns 214 and 201, respectively. Accordingly, if the low cut filter 752 and the signal pattern 214 become a stub and then resonance occurs, the high cut filter 751 can attenuate the frequency of the resonance. Consequently, the high frequency characteristic of the semiconductor relay can be improved.

In an embodiment, the switch circuit 4 is formed of one semiconductor switch. For example, in the construction of FIG. 3, one of the semiconductor switches 41 and 42 is removed, and both signal patterns corresponding to the removed semiconductor switch are mutually joined. In this instance, the one semiconductor switch may be, but not limited to a MOSFET, e.g., a bipolar transistor. Similarly, the switch circuit 5 may be formed of one semiconductor switch.

Although the present invention has been described with reference to certain preferred embodiments, numerous modifications and variations can be made by those skilled in the art without departing from the true spirit and scope of this invention.

The invention claimed is:

1. A semiconductor relay, comprising:
   first and second signal terminals;

a substrate comprising signal patterns for forming a signal line, and a land, the signal patterns being located between the first and second signal terminals and being separated from each other;

a first switch circuit comprising a semiconductor switch that is used to make or break a connection between the signal patterns and thereby to make or break a connection between the first and second signal terminals; and a control circuit comprising a control IC that is configured to control the first switch circuit to make or break the connection between the first and second signal terminals, wherein:

the control IC is mounted on the land, the land having a size corresponding to the control IC, and a part or all of the land being included in a part of the signal patterns, the substrate is a dielectric substrate, the signal patterns for forming the signal line are in a shape of a straight line having a constant width, and are formed on a first surface of the substrate having a certain width, a ground pattern being formed on a second surface of the substrate along the signal patterns, the signal patterns in the shape of the straight line comprise:

a first signal pattern connected to the first signal terminal;

a second signal pattern connected to the second signal terminal; and a third signal pattern that is located between ends of the first and second signal patterns in an intermediate part of the signal line, and is separated from each of the first and second patterns, the third signal pattern includes the part or all of the land and is electrically insulated from the ground pattern by the substrate, the signal patterns including the part or all of the land, the ground pattern and the substrate constitute a microstrip line, and the first switch circuit is configured to make or break a connection between the first signal pattern and the third signal pattern, and to make or break a connection between the second signal pattern and the third signal pattern.

2. The semiconductor relay of claim 1,
wherein the first switch circuit comprises:
a first semiconductor switch configured to make or break the connection between the first and third signal patterns; and
a second semiconductor switch configured to make or break the connection between the second and third signal patterns,
wherein the control IC is configured to control the first and second semiconductor switches to make or break the connection between the first and second signal terminals, and
wherein the part of the land is included in the third signal pattern, while a remaining part of the land protrudes from a side of the third signal pattern.

3. The semiconductor relay of claim 2,
wherein the control IC comprises a first control output terminal, and a second control output terminal connected to the third signal pattern through a wire, and
wherein the first and second semiconductor switches are mounted on the ends of the first and second signal patterns, respectively, each of the first and second semiconductor switches being a surface mount N channel MOSFET having a drain, a source and a gate, the drains of the first and second semiconductor switches being directly connected to the ends of the first and second signal patterns, respectively, the sources of the first and second semiconductor switches being connected to the third signal pattern through wires, and the gates of the first and second semiconductor switches being connected to the first control output terminal through wires.

4. The semiconductor relay of claim 2, further comprising:
first and second control input terminals;
a light emitting element that emits light in response to an input signal from the first and second control input terminals;
a first low-pass filter connected between the first control input terminal and one end of the light emitting element; and
a second low-pass filter connected between the second control input terminal and the other end of the light emitting element,
wherein the control IC comprises a light receiving element for receiving the light from the light emitting element, and is configured to control the first and second semiconductor switches in response to the input signal.

5. The semiconductor relay of claim 1,
wherein the first switch circuit comprises:
a first semiconductor switch configured to make or break the connection between the first and third signal patterns; and
a second semiconductor switch configured to make or break connection between the second and third signal patterns,
wherein the control circuit comprises first and second control ICs, and is configured to control the first and second semiconductor switches to make or break the connection between the first and second signal terminals, the first control IC being configured to control the first semiconductor switch to make or break the connection between the first and third signal patterns, and the second control IC being configured to control the second semiconductor switch to make or break the connection between the second and third signal patterns, and
wherein the substrate comprises:
a first land on which the first control IC is mounted; and
a second land on which the second control IC is mounted,
a part of the first land being included in the first signal pattern, a remaining part of the first land protruding from a side of the first signal pattern, a part of the second land being included in the second signal pattern, and a remaining part of the second land protruding from a side of the second signal pattern.

6. The semiconductor relay of claim 5,
wherein each of the first and second control ICs comprises first and second control output terminals, the second control output terminals of the first and second control ICs being connected to the first and second signal patterns through wires, respectively,
wherein the first and second semiconductor switches are mounted on both ends of the third signal pattern, each of the first and second semiconductor switches being a surface mount N channel MOSFET having a drain, a source and a gate, the drains of the first and second semiconductor switches being directly connected to the third signal pattern, the sources of the first and second semiconductor switches being connected to the first and second signal patterns through wires, respectively, and the gates of the first and second semiconductor switches being connected to the first control output terminals of the first and second control ICs through wires, respectively.

7. The semiconductor relay of claim 5, further comprising:
first, second, third and fourth control input terminals;
a first light emitting element that emits light in response to a first input signal from the first and second control input terminals;
a second light emitting element that emits light in response to a second input signal from the third and fourth control input terminals;
a first low-pass filter connected between the first control input terminal and one end of the first light emitting element;
a second low-pass filter connected between the second control input terminal and the other end of the first light emitting element;
a third low-pass filter connected between the third control input terminal and one end of the second light emitting element; and
a fourth low-pass filter connected between the fourth control input terminal and the other end of the second light emitting element,
wherein the first control IC comprises a first light receiving element for receiving the light from the first light emitting element, and is configured to control the first semiconductor switch in response to the first input signal, and the second control IC comprises a second light receiving element for receiving the light from the second light emitting element, and is configured to control the second semiconductor switch in response to the second input signal.

8. The semiconductor relay of any one of claims 2-7, further comprising:
a third signal terminal;
a diverging circuit comprising a low-pass filter connected to a divergence point in one of the first and second signal patters; and
a second switch circuit comprising a semiconductor switch configured to make or break a connection between the low-pass filter of the diverging circuit and the third signal terminal, thereby making or breaking a connection between the third signal terminal and the divergence point.

9. The semiconductor relay of claim 8, wherein the low-pass filter of the diverging circuit is a surface mount device and is directly mounted on the divergence point.

10. The semiconductor relay of claim 9, wherein a width of a part with the divergence point in one of the first and second signal patterns is narrower than that of a part without the divergence point.

11. The semiconductor relay of any one of claims 2-7, further comprising:
a third signal terminal;
a diverging circuit comprising a composite filter connected to a divergence point in one of the first and second signal patters; and
a second switch circuit comprising a semiconductor switch configured to make or break a connection between the composite filter and the third signal terminal, thereby making or breaking a connection between the third signal terminal and the divergence point,
wherein the composite filter is formed of a high cut-off filter and a low cut-off filter.

12. The semiconductor relay of claim 11, wherein:
the low-cut filter is connected to the divergence point, and
the high-cut filter is connected between the low-cut filter and the second switch circuit.

* * * * *